US009763343B2

United States Patent
Kim et al.

(10) Patent No.: US 9,763,343 B2
(45) Date of Patent: Sep. 12, 2017

(54) ELECTRONIC DEVICE INCLUDING CONNECTING MEMBER

(71) Applicant: Samsung Electronics Co., Ltd., Suwon-si, Gyeonggi-do (KR)

(72) Inventors: Yeon-Woo Kim, Suwon-si (KR); Jeong Woo, Yongin-si (KR); Jung-Sik Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/272,960

(22) Filed: Sep. 22, 2016

(65) Prior Publication Data

US 2017/0094818 A1 Mar. 30, 2017

(30) Foreign Application Priority Data

Sep. 24, 2015 (KR) .................. 10-2015-0135430

(51) Int. Cl.
| | |
|---|---|
| *H05K 9/00* | (2006.01) |
| *H02G 3/18* | (2006.01) |
| *H04M 1/00* | (2006.01) |
| *H05K 5/00* | (2006.01) |
| *H01R 12/57* | (2011.01) |
| *H01R 13/24* | (2006.01) |
| *H05K 1/02* | (2006.01) |

(52) U.S. Cl.
CPC .......... *H05K 5/0047* (2013.01); *H01R 12/57* (2013.01); *H01R 13/2407* (2013.01); *H05K 1/0213* (2013.01); *H05K 5/0017* (2013.01)

(58) Field of Classification Search
CPC .. H05K 5/0047; H05K 5/0017; H05K 1/0213; H01R 12/57; H01R 13/2407
USPC ............ 174/351, 354, 362; 455/575.1, 575.5
See application file for complete search history.

(56) References Cited

U.S. PATENT DOCUMENTS

| | | | | |
|---|---|---|---|---|
| 5,107,404 A | * | 4/1992 | Tam .................. | H04B 1/38 361/736 |
| 6,262,887 B1 | * | 7/2001 | Lee .................. | G06F 1/1616 361/679.27 |
| 6,463,263 B1 | * | 10/2002 | Feilner ............. | H04B 1/3816 455/348 |
| 7,458,844 B2 | * | 12/2008 | Chen ................ | H05K 1/0215 439/507 |
| 2013/0169508 A1 | * | 7/2013 | Chang .............. | H01Q 1/50 343/906 |

(Continued)

*Primary Examiner* — Sherman Ng
(74) *Attorney, Agent, or Firm* — Jefferson IP Law, LLP

(57) ABSTRACT

An electronic device is provided. The electronic device includes a housing that includes a first surface directed in the first direction, a second surface directed in a second direction opposite to the first direction, and a lateral side that surrounds, at least in part, a space formed between the first surface and the second surface, a display, an antenna radiating body, a printed circuit board including a first hole and a metal member positioned in the first hole, a flexible connecting member disposed between a portion of the antenna radiating body and a portion of the metal member, a conductive plate configured for contacting the connecting member, or being formed by a portion of the connecting member to include a second hole, and a coupling member for coupling the conductive plate to the printed circuit board by passing through the second hole and contacting with the metal member.

20 Claims, 10 Drawing Sheets

(56) References Cited

U.S. PATENT DOCUMENTS

| | | | |
|---|---|---|---|
| 2013/0267284 A1* | 10/2013 | Ryu | H04W 88/06 455/575.7 |
| 2014/0210675 A1* | 7/2014 | Hwang | H01Q 1/44 343/702 |
| 2014/0232607 A1* | 8/2014 | Lee | H01Q 1/526 343/841 |
| 2014/0243052 A1* | 8/2014 | Hobson | H01Q 1/243 455/575.7 |
| 2015/0077294 A1* | 3/2015 | Lin | H01Q 1/22 343/702 |

* cited by examiner

ELECTRONIC DEVICE INCLUDING CONNECTING MEMBER

CROSS REFERENCE TO RELATED APPLICATION(S)

This application claims the benefit under 35 U.S.C. §119 (a) of a Korean patent application filed on Sep. 24, 2015 in the Korean Intellectual Property Office and assigned Serial number 10-2015-0135430, the entire disclosure of which is hereby incorporated by reference.

TECHNICAL FIELD

The present disclosure relates to an electronic device.

BACKGROUND

Typically, the electronic devices may refer to devices that execute specific functions according to programs installed therein, such as an electronic organizer, portable multimedia players, mobile communication terminals, a tablet personal computer (PC), video/audio devices, desktop/laptop computers, a car navigation system, as well as home appliances. For example, such electronic devices may output stored information in the form of a sound or video. As the integration of the electronic devices increases and as high-speed and high-capacity wireless communications become more common, as in recent years, a variety of functions have been adopted in a single electronic device, such as a mobile communication terminal. For example, an entertainment function (such as games, a multimedia function, such as reproduction of music/videos) a communication and security function for mobile banking, schedule management, and an electronic wallet, as well as a communication function, have been integrated into a single electronic device.

Such electronic devices may include various types of connection structures for an electrical connection between the components. For example, connecting terminals for connecting circuit boards installed in the electronic device to a battery and an antenna, and connectors for connecting circuit boards with each other may be mounted on the circuit board. Additionally or alternatively, connecting circuits (e.g., wires including printed circuit patterns) for connecting integrated circuit chips mounted on the circuit board, active/passive devices, connecting terminals, and connectors to each other may be provided.

The above information is presented as background information only to assist with an understanding of the present disclosure. No determination has been made, and no assertion is made, as to whether any of the above might be applicable as prior art with regard to the present disclosure.

SUMMARY

Connecting terminals, such as C-clips or pogo pins, may be mounted on the circuit board to protrude therefrom in order to come into contact with other components or other structures, such as a battery or an antenna, through surface mounting technology (SMT). Since the connecting terminals are mounted on the circuit board to protrude therefrom, they may be interfered with by external objects. Additionally or alternatively, the connecting terminals may be interfered with by structures, such as a housing, during the process of mounting the circuit board into the electronic device. The connecting terminals may become detached from the circuit board due to such interference.

Aspects of the present disclosure are to address at least the above-mentioned problems and/or disadvantages and to provide at least the advantages described below. Accordingly, an aspect of the present disclosure is to provide an electronic device including connecting terminals that can be mounted on the circuit board.

Another aspect of the present disclosure is to provide an electronic device including connecting terminals that can form an electrical connection between the components.

In accordance with another aspect of the present disclosure, an electronic device is provided. The electronic device includes a housing that includes a first surface directed in a first direction, a second surface directed in a second direction substantially opposite to the first direction, and a lateral side that surrounds, at least in part, a space formed between the first surface and the second surface, a display exposed through the first surface of the housing, an antenna radiating body that forms at least a portion of the lateral side of the housing, a printed circuit board disposed in the housing, and that includes a first hole and a metal member disposed, at least in part, in the first hole, a flexible connecting member that is disposed between at least a portion of the antenna radiating body and at least a portion of the metal member, and that includes a conductive material, a conductive plate configured for contacting with the connecting member, or being formed by a portion of the connecting member to include a second hole, and a coupling member configured for coupling the conductive plate to the printed circuit board by passing through the second hole of the conductive plate, and contacting with the metal member.

According to various embodiments, the antenna radiating body may be electrically connected to the printed circuit board through the connecting member, the conductive plate, and/or the coupling member in order to thereby transmit/receive wireless signals.

According to various embodiments, it may be possible to mount the connecting terminals (e.g., the connecting member and/or the conductive plate) onto the printed circuit board in the state in which the printed circuit board is installed in the housing.

In accordance with another aspect of the present disclosure, an electronic device is provided. The electronic device includes a housing comprising a lateral side of which a portion forms an antenna radiating body, a printed circuit board configured for being disposed in the housing, and that includes a communication circuit, a flexible connecting member of which a portion thereof is configured for coming into contact with the antenna radiating body, and a conductive plate configured for coming into contact with the connecting member, or being formed by a portion of the connecting member to be mounted on the printed circuit board, wherein the connecting member may include a support piece that is extended from the conductive plate to be supported by a lateral side of the printed circuit board, and an elastic piece that is extended from the support piece to face, at least in part, the support piece, and wherein the elastic piece is configured for coming into contact with the antenna radiating body to connect the antenna radiating body to the communication circuit.

The electronic device, according to various embodiments of the present disclosure, can stably fix the connecting terminal by mounting the connecting terminal on the printed circuit board by utilizing a coupling member, such as a screw. According to various embodiments, the connecting terminal may be mounted on the printed circuit board in the state in which the printed circuit board is installed in the housing of the electronic device in order to thereby prevent the connecting terminal from being detached in the process of manufacturing, transporting, and assembling the printed circuit board. For example, the electronic device, according to various embodiments of the present disclosure, may improve the defect in which the connecting terminal is detached from the printed circuit board. According to various embodiments, the connecting terminal may be stably mounted and fixed to the printed circuit board in order to thereby reduce a failure rate so that the electrical connection between the components can be stably secured in the electronic device.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
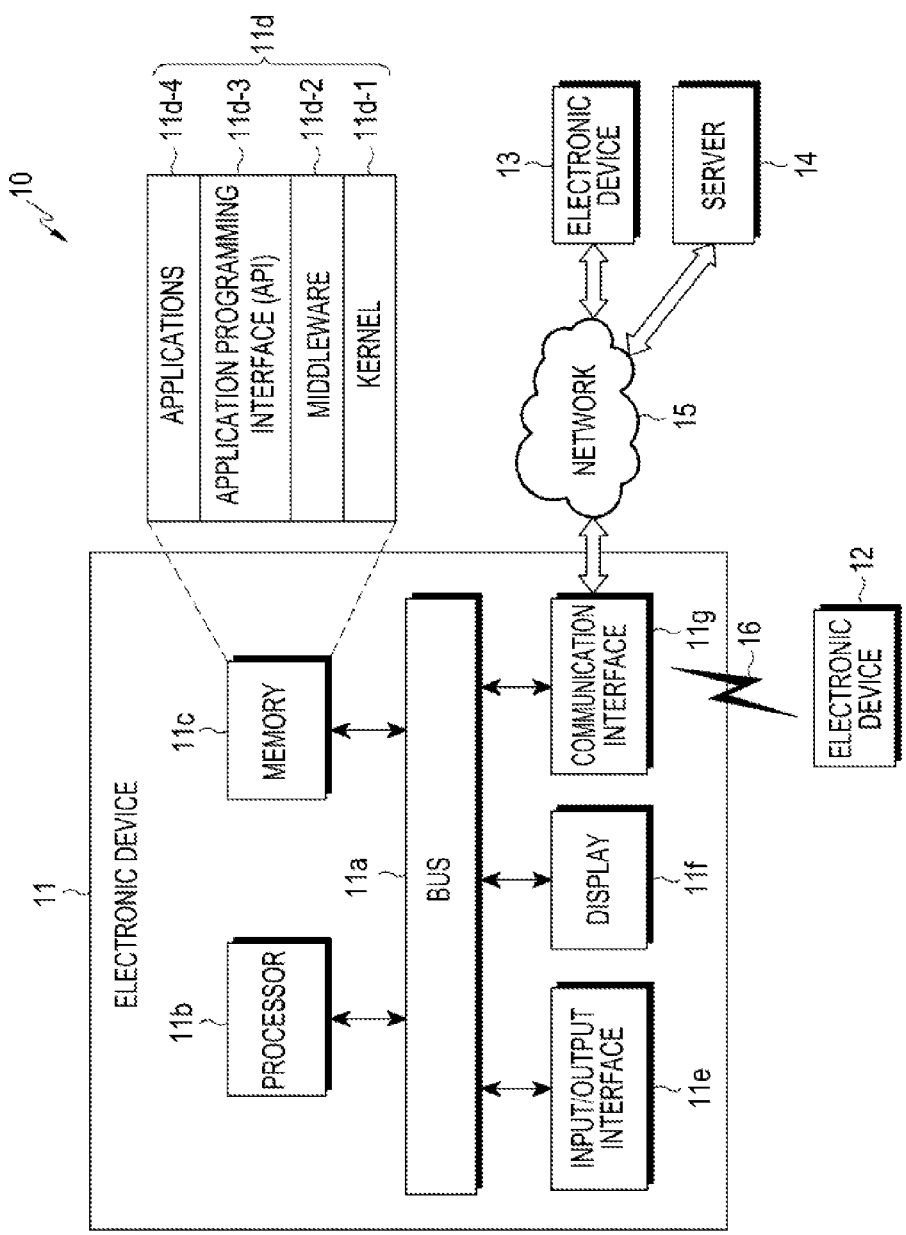
FIG. 1 is a view illustrating a network environment including an electronic device according to various embodiments of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In the present disclosure, the expression "A or B", "at least one of A or/and B", or "one or more of A or/and B" may include all possible combinations of the items listed. For example, the expression "A or B", "at least one of A and B", or "at least one of A or B" refers to all of (1) including at least one A, (2) including at least one B, or (3) including all of at least one A and at least one B.

The expression "a first", "a second", "the first", or "the second" used in various embodiments of the present disclosure may modify various components regardless of the order and/or the importance but does not limit the corresponding components. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

The expression "configured to" used in the present disclosure may be exchanged with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

In the present disclosure, the terms are used to describe specific embodiments, and are not intended to limit the present disclosure. As used herein, the singular forms are intended to include the plural forms as well, unless the context clearly indicates otherwise. In the description, it should be understood that the terms "include" or "have" indicate existence of a feature, a number, an operation, a structural element, parts, or a combination thereof, and do not previously exclude the existences or probability of addition of one or more another features, numeral, operations, structural elements, parts, or combinations thereof.

Unless defined differently, all terms used herein, which include technical terminologies or scientific terminologies, have the same meaning as that understood by a person skilled in the art to which the present disclosure belongs. Such terms as those defined in a generally used dictionary are to be interpreted to have the meanings equal to the contextual meanings in the relevant field of art, and are not to be interpreted to have ideal or excessively formal meanings unless clearly defined in the present specification. In some cases, even the term defined in the present disclosure should not be interpreted to exclude embodiments of the present disclosure.

In the present disclosure, an electronic device may be a random device, and the electronic device may be called a terminal, a portable terminal, a mobile terminal, a communication terminal, a portable communication terminal, a portable mobile terminal, a display device or the like.

For example, the electronic device may be a smartphone, a portable phone, a game player, a TV, a display unit, a heads-up display unit for a vehicle, a notebook computer, a laptop computer, a tablet personal computer (PC), a personal media player (PMP), a personal digital assistants (PDA), and the like. The electronic device may be implemented as a portable communication terminal which has a wireless communication function and a pocket size. Further, the electronic device may be a flexible device or a flexible display device.

The electronic device may communicate with an external electronic device, such as a server or the like, or perform an operation through an interworking with the external electronic device. For example, the electronic device may transmit an image photographed by a camera and/or position information detected by a sensor unit to the server through a network. The network may be a mobile or cellular communication network, a local area network (LAN), a wireless LAN (WLAN), a wide area network (WAN), an Internet, a small area network (SAN) or the like, but is not limited thereto.

FIG. 1 is a view illustrating a network environment 10 including an electronic device 11 according to various embodiments of the present disclosure.

Referring to FIG. 1, the electronic device 11 in the network environment 10 is disclosed, according to various embodiments. The electronic device 11 may include a bus 11$a$, a processor 11$b$, a memory 11$c$, an input/output interface 11$e$, a display 11$f$, and a communication interface 11$g$. In some embodiments, the electronic device 11 may exclude one or more elements or may add other elements thereto.

The bus 11$a$, for example, may include a circuit for connecting the elements 11$a$ to 11$g$ with each other and for transferring communication data (e.g., control messages and/or data) between the elements.

The processor 11$b$ may include at least one of a central processing unit (CPU), an application processor (AP), or a communication processor (CP). The processor 11$b$, for example, may process a calculation or data that is related to the control and/or communication of one or more other elements of the electronic device 11.

Referring to FIG. 1, the memory 11$c$ may include a volatile and/or non-volatile memory. For example, the memory 11$c$ may store instructions or data in relation to one or more other elements of the electronic device 11. According to an embodiment, the memory 11$c$ may store software and/or programs 11$d$. For example, the programs 11$d$ may include a kernel 11$d$-1, middleware 11$d$-2, an application programming interface (API) 11$d$-3, and/or an application programs (or "applications") 11$d$-4. At least some of the kernel 11$d$-1, the middleware 11$d$-2, or the API 11$d$-3 may be referred to as an operating system (OS).

The kernel 11$d$-1, for example, may control or manage system resources (e.g., the bus 11$a$, the processor 11$b$, the memory 11$c$, or the like), which are used to execute the operation or functions that are implemented in other programs (e.g., the middleware 11$d$-2, the API 11$d$-3, or the application programs 11$d$-4). In addition, the kernel 11$d$-1 may provide an interface by which the middleware 11$d$-2, the API 11$d$-3, or the application programs 11$d$-4 may access each element of the electronic device 11 in order to thereby control or manage the system resources.

The middleware 11$d$-2, for example, may play the intermediate role between the API 11$d$-3 or the application programs 11$d$-4 and the kernel 11$d$-1 to communicate with each other for the transmission and reception of data.

In addition, the middleware 11$d$-2 may process one or more operation requests that are received from the application programs 11$d$-4 according to the priority. For example, the middleware 11$d$-2 may give priority for using the system resources (e.g., the bus 11$a$, the processor 11$b$, the memory 1ic, or the like) of the electronic device 11 to the one or more application programs 11$d$-4. For example, the middleware 11$d$-2 may perform scheduling or load balancing for the one or more operation requests by processing the one or more operation requests according to the priority given to the one or more application programs 11$d$-4.

The API 11$d$-3, for example, may be an interface by which the applications 11$d$-4 can control functions that are provided by the kernel 11$d$-1 or the middleware 11$d$-2. For example, the API 11$d$-3 may include one or more interfaces or functions (e.g., instructions) for file control, window control, image processing, or text control.

The input/output interface 11$e$, for example, may play the role of an interface that transfers instructions or data received from the user or other external devices to other elements of the electronic device 11. For example, the input/output interface 11$e$ may output instructions or data received from the other elements of the electronic device 11 to the user or the other external devices.

The display 11$f$, for example, may include a liquid crystal display (LCD), a light emitting diode (LED) display, an organic light emitting diode (OLED) display, a plastic OLED (POLED), a micro-electromechanical system (MEMS) display, or an electronic paper display. For example, the display 11f may display a variety of content (e.g., text, images, videos, icons, symbols, or the like) to the user. The display 11f may include a touch screen, and may receive a touch input, a gesture input, a proximity input, or a hovering input by using, for example, electronic pens or a user's body part.

The communication interface 11g, for example, may configure communication between the electronic device 11 and external devices (e.g., the first external electronic device 12, the second external electronic device 13, or a server 14). For example, the communication interface 11g may be connected to the network 15 through wireless communication or wired communication in order to thereby communicate with the external devices (e.g., the second external electronic device 13, or the server 14).

For example, the wireless communication may use, as a cellular communication protocol, at least one of long term evolution (LTE), LTE Advance (LTE-A), code division multiple access (CDMA), wideband CDMA (WCDMA), a universal mobile telecommunications system (UMTS), wireless broadband (WiBro), Global System for Mobile Communications (GSM), or the like. In addition, the wireless communication, for example, may include a short-range communication 16. The short-range communication 16 may include at least one of wireless fidelity (Wi-Fi), Bluetooth (BT), near field communication (NFC), or a global navigation satellite system (GNSS). The GNSS, for example, may include at least one of a global positioning system (GPS), a global navigation satellite system (Glonass), the Beidou Navigation Satellite System (hereinafter, "Beidou"), the Galileo, or the European global satellite-based navigation system according to the usage area or bandwidth. Hereinafter, "GPS" may be interchangeably used with "GNSS" in the present specification. For example, the wired communication may include at least one of a universal serial bus (USB), a high definition multimedia interface (HDMI), recommended standard 232 (RS-232), or a plain old telephone service (POTS). The network 15 may include at least one of various telecommunication networks, such as a computer network (e.g., LAN or WAN), the Internet, or a telephone network.

Referring to FIG. 1, the first external electronic device 12 and the second external electronic device 13 may be the same as, or different from, the electronic device 11 in its type. According to an embodiment, the server 14 may include a group of one or more servers. According to various embodiments, at least some, or all, of the operations that are executed in the electronic device 11 may be executed by one or more other electronic devices (e.g., the electronic device 12 or 13, or the server 14). According to an embodiment, in the case where the electronic device 11 executes a specific function or service automatically or by request, the electronic device 11 may make a request to the other devices (e.g., the electronic device 12 or 13, or the server 14) for at least some of the functions related to the function or service additionally or instead of executing the same by itself The other electronic devices (e.g., the electronic device 12 or 13, or the server 14) may execute the requested function or additional function, and may transfer the result thereof to the electronic device 11. The electronic device 11 may provide the requested function or service by providing the result or by additionally processing the same. To this end, for example, cloud computing, distributed computing, or client-server computing technology may be used.

Figure 2:
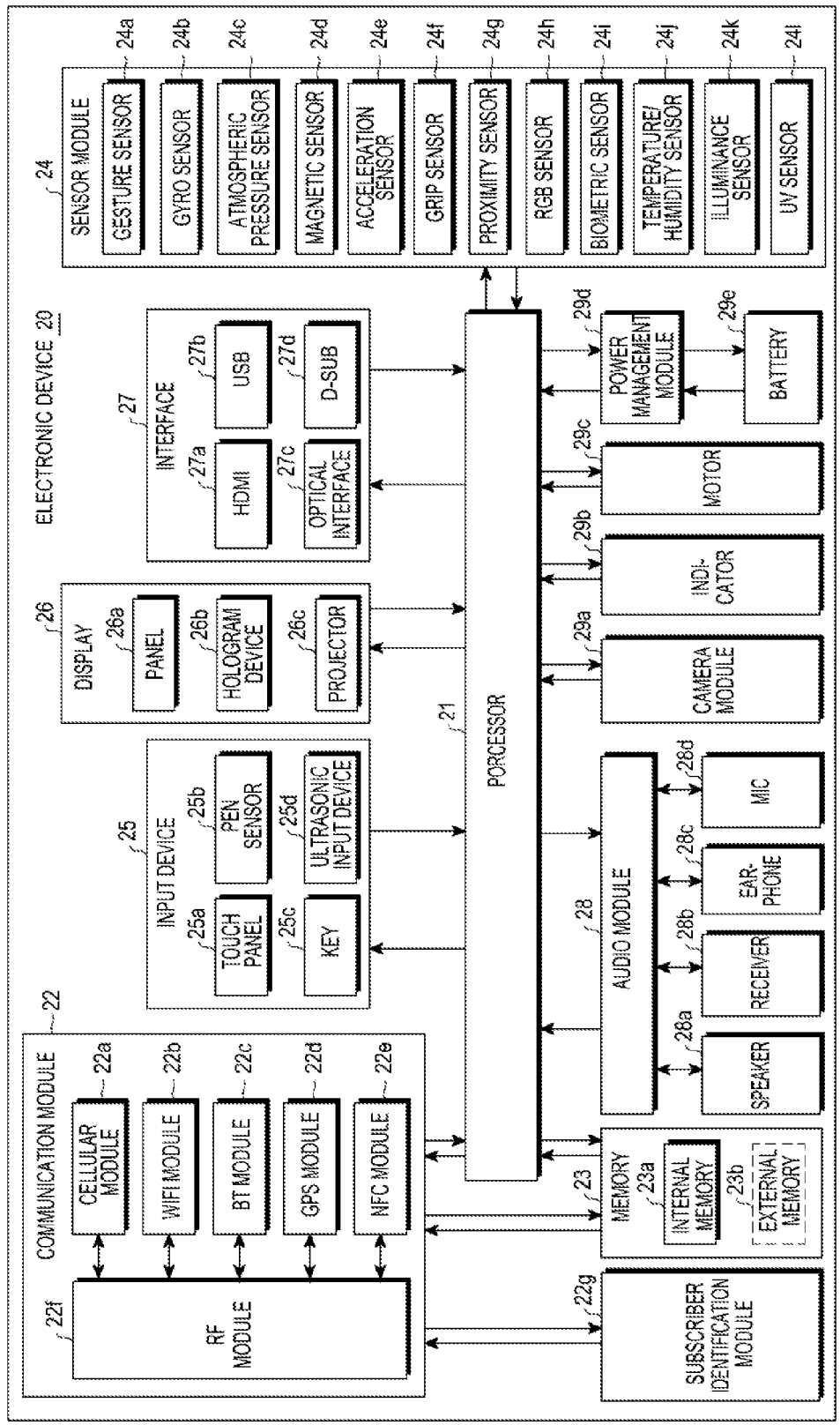
FIG. 2 is a block diagram illustrating an electronic device according to an embodiment of the present disclosure.

FIG. 2 is a block diagram of an electronic device 20 according to various embodiments.

Referring to FIG. 2, the electronic device 20, for example, may include all or some of the elements of the electronic device 11 shown in FIG. 1. The electronic device 20 may include one or more processors (e.g., application processors (AP)) 21, a communication module 22, a subscriber identification module 22g, a memory 23, a sensor module 24, an input device 25, a display 26, an interface 27, an audio module 28, a camera module 29a, a power management module 29d, a battery 29e, an indicator 29b, or a motor 29c.

The processor 21, for example, may control a multitude of hardware or software elements connected with the processor 21, and may perform the processing of various pieces of data and a calculation by executing an operating system or application programs. The processor 21 may be implemented by, for example, a system on chip (SoC). According to an embodiment, the processor 21 may further include a graphic processing unit (GPU) and/or an image signal processor. The processor 21 may include at least some (e.g., the cellular module 22a) of the elements shown in FIG. 2. The processor 21 may load instructions or data received from one or more other elements (e.g., a non-volatile memory) to a volatile memory to then process the same, and may store a variety of data in a non-volatile memory.

The communication module 22 may have the same or a similar configuration as the communication interface 11g shown in FIG. 1. The communication module 22, for example, may include a cellular module 22a, a Wi-Fi module 22b, a Bluetooth (BT) module 22c, a GPS module 22d (e.g., a GNSS module, a Glonass module, the Beidou module, or the Galileo module), an NFC module 22e, or a radio frequency (RF) module 22f.

The cellular module 22a, for example, may provide voice calls, video calls, text messaging, or the Internet services through communication networks. According to an embodiment, the cellular module 22a may perform identification and verification of the electronic device 20 in communication networks by using the subscriber identification module (e.g., a subscriber identity module (SIM) card) 22g. According to an embodiment, the cellular module 22a may perform at least some of the functions that can be provided by the processor 21. According to an embodiment, the cellular module 22a may include a communication processor (CP).

For example, each of the Wi-Fi module 22b, the Bluetooth module 22c, the GNSS module 22d, or the NFC module 22e may include a processor for processing data transmitted and received through the corresponding module. According to some embodiments, at least some (e.g., two or more) of the cellular module 22a, the Wi-Fi module 22b, the Bluetooth module 22c, the GNSS module 22d, or the NFC module 22e may be included in one integrated chip (IC) or one IC package.

The RF module 22f, for example, may transmit and receive communication signals (e.g., RF signals). The RF module 22f may include, for example, a transceiver, a power amp module (PAM), a frequency filter, a low noise amplifier (LNA), antennas, or the like. According to another embodiment, at least one of the cellular module 22a, the Wi-Fi module 22b, the Bluetooth module 22c, the GNSS module 22d, or the NFC module 22e may transmit and receive RF signals through a separated RF module.

The subscriber identification module 22g, for example, may include a card that adopts a subscriber identification module and/or an embedded SIM, and may include inherent identification information (e.g., an integrated circuit card identifier (ICCID)) or subscriber information (e.g., an international mobile subscriber identity (IMSI)).

The memory 23 (e.g., the memory 11c), for example, may include an internal memory 23a or an external memory 23b. The internal memory 23a, for example, may include at least one of volatile memories (e.g., a dynamic RAM (DRAM), a static RAM (SRAM), a synchronous dynamic RAM (SDRAM), or the like} or non-volatile Memories (e.g., an one time programmable ROM (OTPROM), a programmable ROM (PROM), an erasable and programmable ROM (EPROM), an electrically erasable and programmable ROM (EEPROM), a mask ROM, a flash ROM, a flash memory (e.g., NAND flash or NOR flash), a hard drive, a solid state drive (SSD), or the like).

The external memory 23b may further include a flash drive, for example, compact flash (CF), secure digital (SD), micro secure digital (Micro-SD), mini secure digital (Mini-SD), extreme digital (xD), a memory stick, or the like. The external memory 23b may be functionally and/or physically connected with the electronic device 20 through various interfaces.

The sensor module 24, for example, may measure physical quantities or may detect the operation state of the electronic device 20 to thereby convert the measured or detected information to electric signals. The sensor module 24 may include at least one of, for example, a gesture sensor 24a, a gyro-sensor (angular rate or angular velocity sensor) 24b, an atmospheric pressure sensor 24c, a magnetic sensor 24d, an acceleration sensor 24e, a grip sensor 24f, a proximity sensor 24g, a color sensor 24h (e.g., a red-green-blue (RGB) sensor}, a biometric sensor 24i, a temperature/humidity sensor 24j, an illuminance sensor 24k, or an ultraviolet (UV) sensor 24l. Alternatively or additionally, the sensor module 24, for example, may further include an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 24 may further include a control circuit for controlling one or more sensors included therein. In some embodiments, the electronic device 20 may further include a processor, as a part of the processor 21 or separately from the processor 21, which is configured to control the sensor module 24 in order to thereby control the sensor module 24 while the processor 21 is in the sleep mode.

The input device 25, for example, may include a touch panel 25a, a digital stylus or (digital) pen sensor 25b, keys 25c, or an ultrasonic input device 25d. The touch panel 25a, for example, may use at least one of a capacitive type, a pressure-sensitive type, an infrared type, or an ultrasonic type. In addition, the touch panel 25a may further include a control circuit. The touch panel 25a may further include a tactile layer in order to thereby provide a user with a tactile reaction.

For example, the digital stylus or (digital) pen sensor 25b may be a part of the touch panel, or may include a separate recognition sheet. The keys 25c may include, for example, physical buttons, optical keys, or a keypad. The ultrasonic input device 25d detects ultrasonic waves generated by the input means through a microphone (e.g., a microphone 28d) to thereby identify data corresponding to the ultrasonic waves.

The display 26 (e.g., the display 11f) may include a panel 26a, a hologram device 26b, and/or a projector 26c. The panel 26a may have the same, or a different, configuration as the display 11f shown in FIG. 1. The panel 26a may be implemented to be, for example, flexible, transparent, or wearable. The panel 26a may be configured with the touch panel 25a as a single module. The hologram device 26b may display 3D images in the air by using interference of light. The projector 26c may display images by projecting light onto a screen. The screen, for example, may be positioned inside or outside the electronic device 20. According to an embodiment, the display 26 may further include a control circuit for controlling the panel 26a, the hologram device 26b, or the projector 26c.

The interface 27 may include, for example, at least one of a high-definition multimedia interface (HDMI) 27a, a universal serial bus (UBS) 27b, an optical interface 27c, or a D-subminiature (D-sub) 27d. The interface 27 may be included in, for example, the communication interface 11g shown in FIG. 1. Additionally or alternatively, the interface 27 may, for example, include a mobile high-definition link (MHL) interface, a secure digital (SD) card/multi-media card (MMC) interface, or an infrared data association (IrDA) standard interface.

The audio module 28 may convert a sound into an electric signal, and vice versa. At least some elements of the audio module 28 may be included, for example, in the input/output interface 11e shown in FIG. 1. For example, the audio module 28 may process voice information that is input or output through a speaker 28a, a receiver 28b, earphones 28c, or a microphone 28d.

The camera module 29a is a device for photographing still and moving images, and, according to an embodiment, the camera module 29a may include one or more image sensors (e.g., a front sensor or a rear sensor), lenses, an image signal processor (ISP), or a flash (e.g., an LED or a xenon lamp).

The power management module 29d, for example, may manage the power of the electronic device 20. According to an embodiment, the power management module 29d may include a power management integrated circuit (PMIC), a charger integrated circuit (IC), or a battery or fuel gauge. The PMIC may be implemented by a wired charging type and a wireless charging type. The wireless charging type may encompass, for example, a magnetic resonance type, a magnetic induction type, or an electromagnetic wave type, and additional circuits for wireless charging, such as coil loops, resonance circuits, or rectifiers, may be provided. The battery gauge may measure, for example, the remaining power of the battery 29e, a charging voltage, current, or temperature. The battery 29e may include, for example, a rechargeable battery or a solar battery.

The indicator 29b may display a specific state (e.g., a booting state, a message state, or a charging state) of the whole or a part (e.g., the processor 21) of the electronic device 20. The motor 29c may convert an electric signal to a mechanical vibration, and may provide a vibration or a haptic effect. Although it is not shown in the drawing, the electronic device 20 may include a processing device (e.g., a GPU) for supporting mobile TV. The processing device for supporting mobile TV may process media data according to standards, such as digital multimedia broadcasting (DMB), digital video broadcasting (DVB), or mediaFlo™.

Each of the above-described component elements of hardware according to the present disclosure may be configured with one or more components, and the names of the corresponding component elements may vary based on the type of electronic device. The electronic device according to various embodiments of the present disclosure may include at least one of the aforementioned elements. Some elements may be omitted or other additional elements may be further included in the electronic device. Also, some of the hardware components according to various embodiments may be combined into one entity, which may perform functions identical to those of the relevant components before the combination.

The term "module" as used herein may, for example, mean a unit including one of hardware, software, and firmware or a combination of two or more of them. The "module" may be interchangeably used with, for example, the term "unit", "logic", "logical block", "component", or "circuit". The "module" may be a minimum unit of an integrated component element or a part thereof. The "module" may be a minimum unit for performing one or more functions or a part thereof. The "module" may be mechanically or electronically implemented. For example, the "module" according to the present disclosure may include at least one of an application-specific integrated circuit (ASIC) chip, a field-programmable gate arrays (FPGA), and a programmable-logic device for performing operations which has been known or are to be developed hereinafter.

According to various embodiments, at least some of the devices (for example, modules or functions thereof) or the method (for example, operations) according to the present disclosure may be implemented by a command stored in a computer-readable storage medium in a programming module form. The instruction, when executed by a processor (e.g., the processor 11b), may cause the one or more processors to execute the function corresponding to the instruction. The computer-readable storage medium may be, for example, the memory 11c.

The computer readable recoding medium may include a hard disk, a floppy disk, magnetic media (e.g., a magnetic tape), optical media (e.g., a compact disc read only memory (CD-ROM) and a digital versatile disc (DVD)), magneto-optical media (e.g., a floptical disk), a hardware device (e.g., a read only memory (ROM, a random access memory (RAM), a flash memory), and the like. In addition, the program instructions may include high class language codes, which can be executed in a computer by using an interpreter, as well as machine codes made by a compiler. The aforementioned hardware device may be configured to operate as one or more software modules in order to perform the operation of the present disclosure, and vice versa.

The programming module according to the present disclosure may include one or more of the aforementioned components or may further include other additional components, or some of the aforementioned components may be omitted. Operations executed by a module, a programming module, or other component elements according to various embodiments of the present disclosure may be executed sequentially, in parallel, repeatedly, or in a heuristic manner. Further, some operations may be executed according to another order or may be omitted, or other operations may be added. Various embodiments disclosed herein are provided merely to easily describe technical details of the present disclosure and to help the understanding of the present disclosure, and are not intended to limit the scope of the present disclosure. Accordingly, the scope of the present disclosure should be construed as including all modifications or various other embodiments based on the technical idea of the present disclosure.

Figure 3:
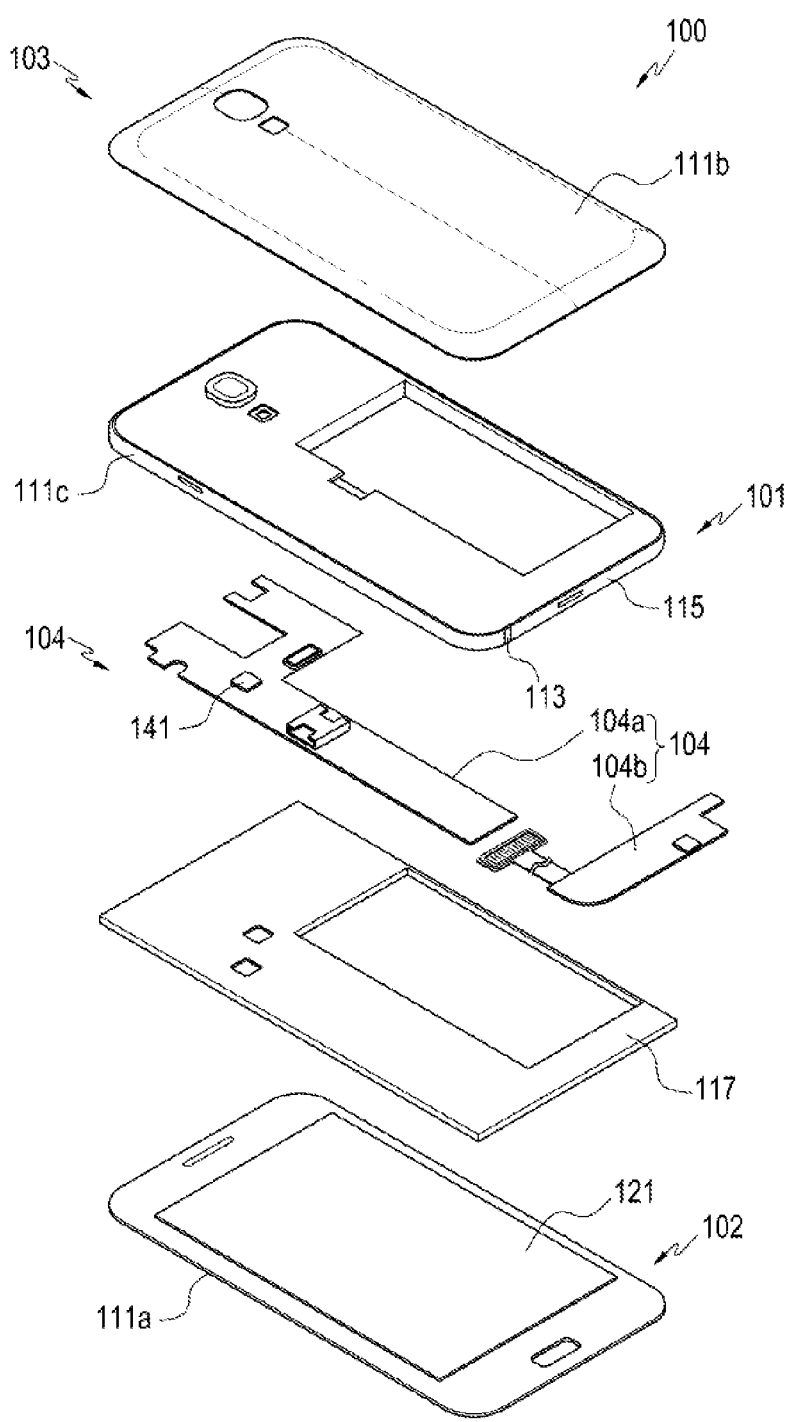
FIG. 3 is an exploded perspective view showing an electronic device according to various embodiments of the present disclosure.

FIG. 3 is an exploded perspective view showing an electronic device 100 according to various embodiments of the present disclosure.

Figure 4:
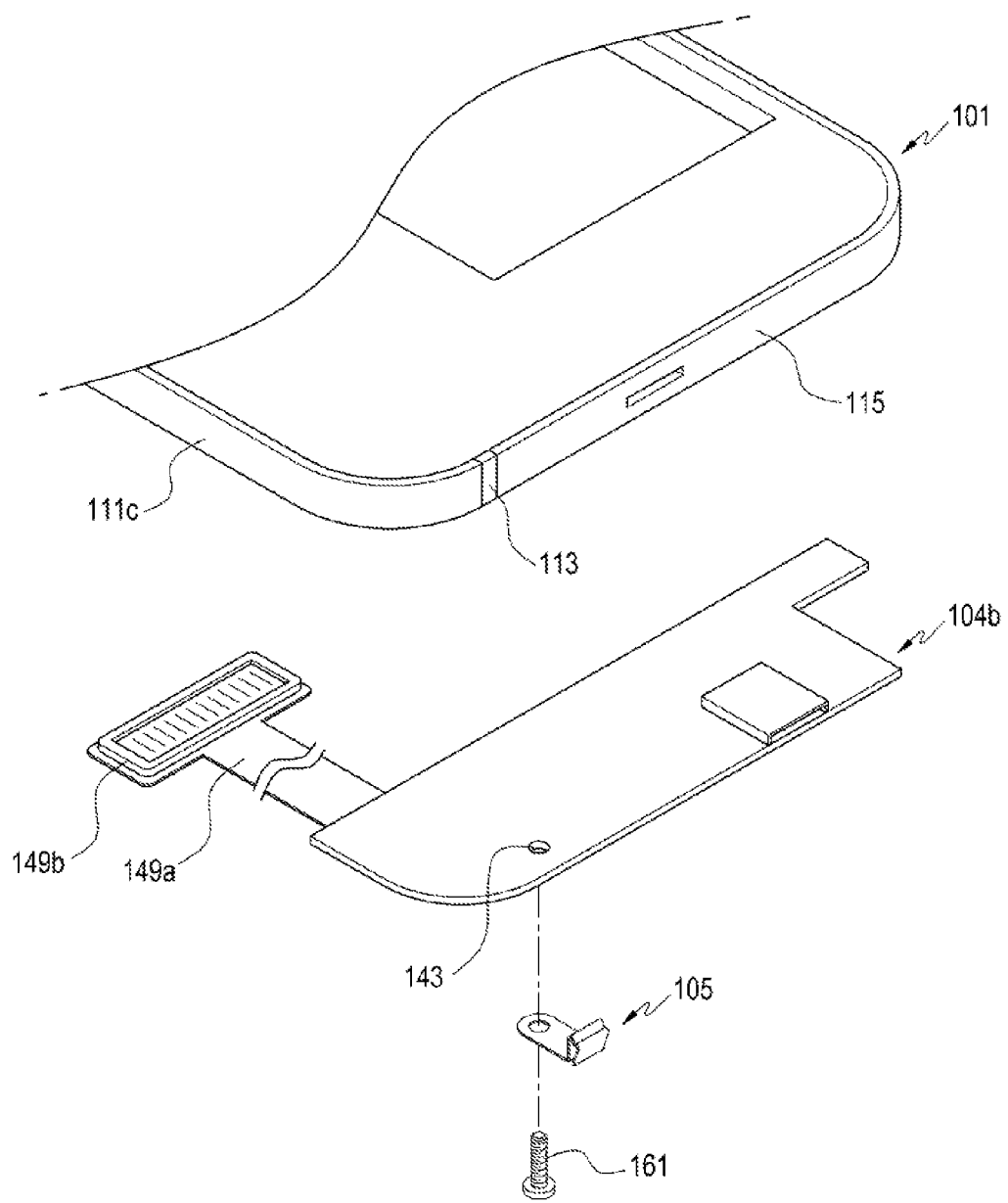
FIG. 4 is an enlarged exploded perspective view illustrating a part of the electronic device according to various embodiments of the present disclosure.

FIG. 4 is an enlarged exploded perspective view illustrating a part of the electronic device according to various embodiments of the present disclosure.

Referring to FIGS. 3 and 4, the electronic device 100 may include a housing, a display 121, an antenna radiating body 115, a printed circuit board 104, a connecting member 105, a conductive plate (e.g., the conductive plate may be formed of a portion of the connecting member 105), and a coupling member 161.

According to various embodiments of the present disclosure, the housing may include a case member 101, a front cover 102 and/or a back cover 103.

The case member 101, according to various embodiments of the present disclosure, may include, at least in part, an electrically conductive material, and may form a lateral side (or a side wall) 111c of the housing and/or the electronic device 100. For example, the lateral side (or the side wall) 111c may be formed to surround, at least in part, a space that is formed between the first surface 111a provided by the front cover 102 and the second surface 111b provided by the back cover 103. According to various embodiments, the printed circuit board 104 may be disposed in the space surrounded by the lateral side 111c.

Referring to FIG. 3, the front cover 102, according to various embodiments of the present disclosure, may be mounted on the case member 101 to provide the first surface 111a that is directed in the first direction. For example, the display 121 may be mounted on the inner surface of the front cover 102 to be exposed to the outside through the first surface 111a. For example, the display 121 may output visual information, such as text, videos, or images, through the front cover 102. According to various embodiments, the front cover 102 may be made of a glass material or of a transparent synthetic resin material so that the visual information output from the display 121 may go through the same to the outside.

The back cover 103, according to various embodiments of the present disclosure, may be mounted on the case member 101 to provide the second surface 111b that is directed in the second direction opposite to the first direction. As another example, the back cover 103 may be formed to be detachable from the case member 101, or may be formed to be integral with case member 101.

The antenna radiating body 115, according to various embodiments of the present disclosure, may be formed of a portion of a conductive material of the case member 101. For example, the lateral side (or the side wall) 111c may be made of a metallic material to be electrically conductive and to allow the appearance of the electronic device 100 to be more aesthetically pleasing. As another example, the antenna radiating body 115 may be formed of at least a portion of the lateral side 111c in order to thereby transmit and receive wireless signals. As another example, the case member 101 may include an insulating portion 113 to insulate the conductive portion to be used for the antenna radiating body 115 from the remaining portion thereof. Although a single insulating portion 113 is illustrated in FIGS. 3 and 4, according to various embodiments of the present disclosure, the number of insulating portions 113 and the positions thereof may vary in consideration of the disposition of the conductive portion in the case member 101, the number of antenna radiating bodies 115 and the size thereof for forming a resonant frequency, or the like.

Referring to FIGS. 3 and 4, the printed circuit board 104, according to various embodiments of the present disclosure, may have components, such as various types of integrated circuit chips 141, active/passive devices, sockets, or connectors, which are mounted thereon, and may provide electrical connections between the components. The printed circuit board 104 may include at least one of a rigid printed circuit board or a flexible printed circuit board. The integrated circuit chips 141, for example, may include integrated circuit chips that have a processor, a communication module, an audio module, or a memory, which is mounted thereon, or may include integrated circuit chips that are combined by two or more modules. According to various embodiments, a plurality of printed circuit boards 104 may be disposed in the housing, and electronic components may be properly distributed and disposed in the printed circuit boards 104. For example, an integrated circuit chip adopting a processor mounted thereon may be disposed in the first printed circuit board 104a among the plurality of the printed circuit boards 104, and a charging connector may be disposed in the second printed circuit board 104b, respectively. According to another example, the first printed circuit board 104a and/or the second printed circuit board 104b may have the first hole 143 (shown in FIG. 4) in order to mount the connecting member 105 (shown in FIG. 4) and/or the conductive plate. Although the first hole 143 is disclosed as being formed in the second printed circuit board 104b in the description of the detailed embodiment of the present disclosure, the present disclosure does not need to be limited thereto.

Referring to FIG. 4, the connecting member 105, according to various embodiments of the present disclosure, for example, may be formed to be flexible (e.g., to have the elasticity). For example, the connecting member 105 may be formed of a metal plate including a conductive material to have, at least in part, the elasticity (or an elastic restoring force). The conductive plate, according to various embodiments, may come into contact with the connecting member 105, or may be formed of a portion of the connecting member 105. For example, in the state in which a portion of the connecting member 105 is interposed between the second printed circuit board 104b and the conductive plate, the coupling member 161 may fix the conductive plate to the second printed circuit board 104b so that the conductive plate may fix the connecting member 105 to the second printed circuit board 104b. Additionally or alternatively, the conductive plate may be formed of a portion of the connecting member 105, and may be mounted and fixed onto the second printed circuit board 104b by the coupling member 161. The configuration of the connecting member 105 and the conductive plate will be described in greater detail with reference to FIG. 5.

The second printed circuit board 104b, according to various embodiments of the present disclosure, may be connected with the first printed circuit board 104a through a connecting board 149a (e.g., a ribbon cable or a flexible printed circuit board). The connecting board 149a is provided with a connector member 149b that is an element for coupling and connecting the connecting board 149a to the first printed circuit board 104a (shown in FIG. 3).

The conductive plate, according to various embodiments of the present disclosure, may have a second hole corresponding to the first hole 143, which will be described in greater detail with reference to FIG. 5.

The coupling member 161, according to various embodiments of the present disclosure, may include, for example, a screw, and may be engaged with the first hole 143 through the second hole in order to thereby fix the conductive plate and/or the connecting member 105 to the printed circuit board 104 (e.g., the second printed circuit board 104b). According to various embodiments, the coupling member 161 may include fasteners, such as a rivet, as well as a screw, or may be formed of a cured solder or solder paste for soldering.

According to various embodiments, a support plate 117 (shown in FIG. 4) is disposed inside the case member 101 in order to thereby improve the rigidity of the electronic device 100. In addition, the support plate 117 may be made, at least in part, of a metallic material or other suitable material, for acting as a shielding member to block the electromagnetic interference between the electronic components inside the electronic device 100.

Figure 5:
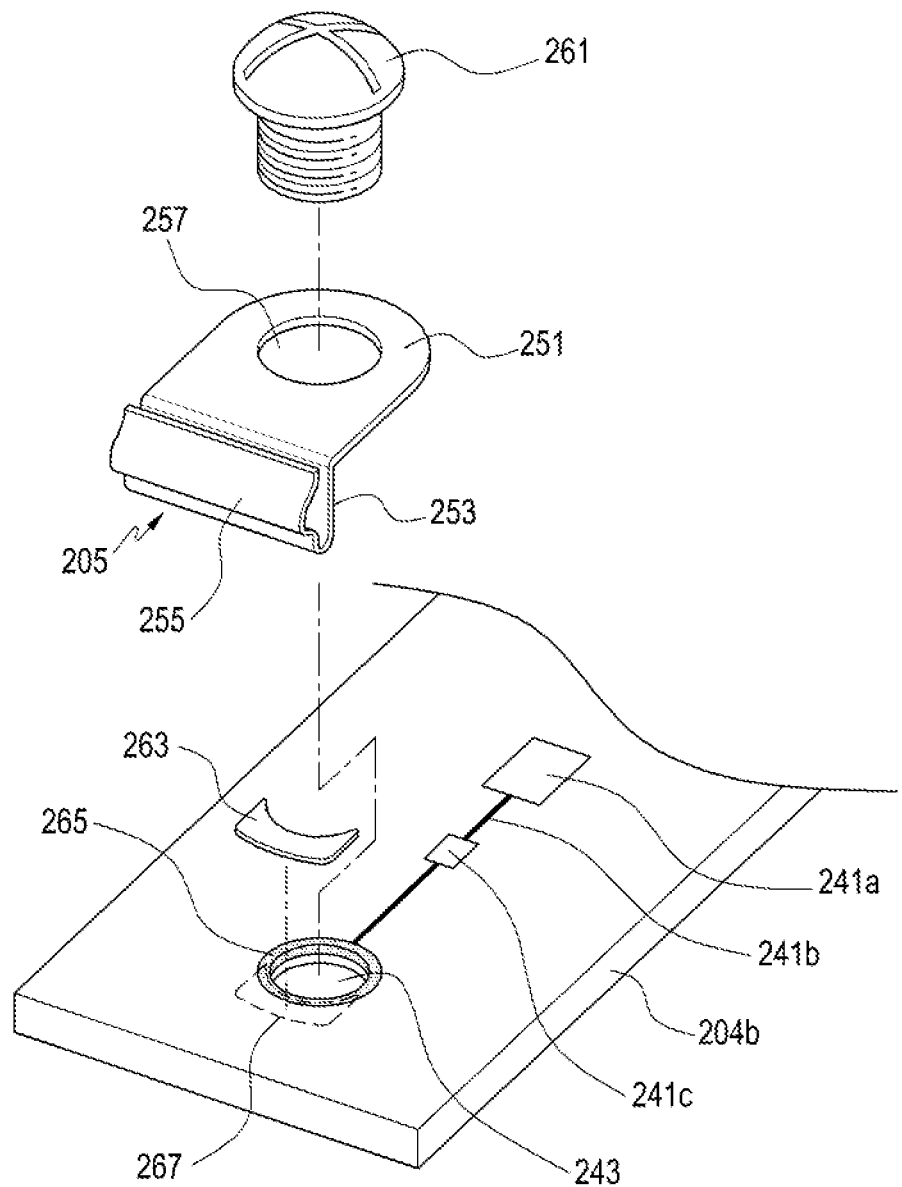
FIG. 5 is an exploded perspective view showing the state in which a connecting member of the electronic device is mounted on the printed circuit board according to various embodiments of the present disclosure.

FIG. 5 is an exploded perspective view showing the state in which the connecting member 205 of the electronic device is mounted on the printed circuit board according to various embodiments of the present disclosure.

Figure 6:
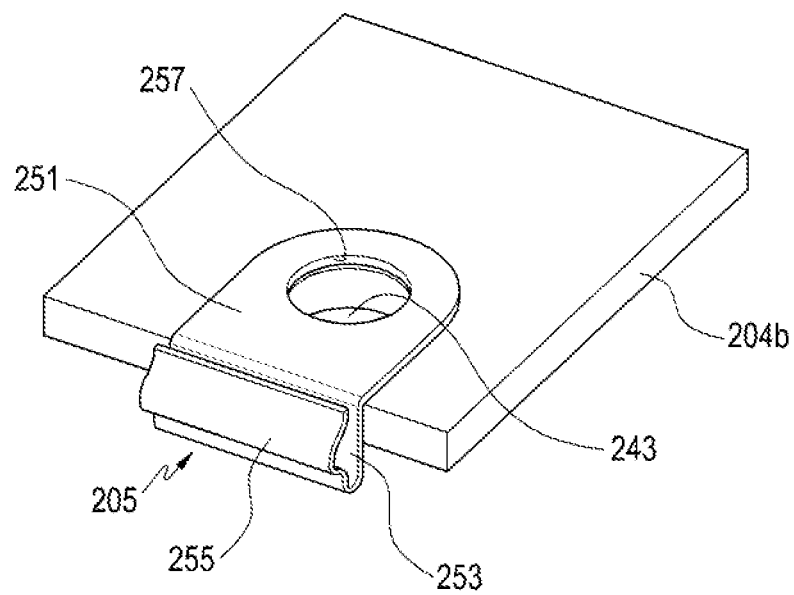
FIG. 6 is a perspective view showing the state in which a connecting member of the electronic device is mounted on the printed circuit board according to various embodiments of the present disclosure.

FIG. 6 is a perspective view showing the state in which the connecting member 205 of the electronic device is mounted on the printed circuit board according to various embodiments of the present disclosure.

Referring to FIGS. 5 and 6, according to various embodiments of the present disclosure, the printed circuit board 204b (e.g., the printed circuit board 104b shown in FIG. 4) may include a metal member 265 that is positioned on the first hole 243 (e.g., the first hole 143 shown in FIG. 4). For example, the metal member 265 may be shaped to come into contact with both one surface of the printed circuit board 204b and at least a portion of an outer periphery of the first hole 243, as shown in FIG. 5. According to various embodiments, the metal member 265 may be connected to the communication circuit 241a (e.g., a radio frequency (RF) module) through a wire (e.g., a connecting circuit 241b) that is formed on the printed circuit board 204b. According to various embodiments, the communication circuit 241a may be provided to the printed circuit board 204b, and may be disposed on the integrated circuit chip (e.g., the integrated circuit chips 141 shown in FIG. 3) of the first printed circuit board 104a described above. For example, if the communication circuit 241a is disposed on the first printed circuit board 104a (shown in FIG. 3), the connecting circuit 241b may include the aforementioned connecting board 149a and the connector member 149b (shown in FIG. 4).

Referring to FIG. 5, the antenna radiating body (e.g., the antenna radiating body 115 shown in FIGS. 3 and 4), according to various embodiments, may be connected to the communication circuit 241a through the connecting member 205 (e.g., the connecting member 105 shown in FIG. 4), the conductive plate 251 (e.g., the conductive plate 151 shown in FIG. 4), the metal member 265, and/or the connecting circuit 241b. For example, the antenna radiating body 115 may be supplied with power from the communication circuit 241a in order to thereby transmit and receive wireless signals. According to various embodiments, the electronic device (e.g., the electronic device 100 shown in FIG. 3) may further include an impedance matching circuit 241c for the antenna radiating body 115 in relation to the power supply from the communication circuit 241a. The impedance matching circuit 241c may be a part of the connecting circuit 241b, and may adjust and stabilize the radiation characteristics (e.g., the resonant frequency) when transmitting and receiving wireless signals through the antenna radiating body 115.

According to various embodiments, the conductive plate 251 may have a planar shape that faces one side of the printed circuit board 204b, and may have the second hole 257 corresponding the first hole 243. For example, the conductive plate 251 may be mounted on the printed circuit board 204b while the second hole 257 is aligned with the first hole 243.

According to various embodiments, the connecting member 205 may include a support piece 253 that is extended to be bent from the conductive plate 251 and an elastic piece 255 that is extended from the support piece 253. According to various embodiments, when the connecting member 205 is mounted on the printed circuit board 204*b*, the support piece 253 may come into contact with one lateral side of the printed circuit board 204*b* to then be supported by the same. According to various embodiments, the elastic piece 255 may be extended from the support piece 253 such that at least a portion of the elastic piece 255 faces the support piece 253. According to various embodiments, the elastic piece 255 may be deformed in the direction that approaches, or moves away from, the support piece 253 while facing the support piece 253, and may be restored to the originally produced shape because of the elastic restoring force when no external force is applied thereto. According to an embodiment of the present disclosure, although the conductive plate 251 is formed to be a part of the connecting member 205, according to various embodiments, the conductive plate 251 may be manufactured to be a separate component from the connecting member 205. According to various embodiments, one end of the elastic piece 255 may be positioned between the surface of the conductive plate 251 and the other surface of the printed circuit board 204*b*. For example, one end of the elastic piece 255 may be positioned to be lower than the surface of the conductive plate 251 from the other surface of the printed circuit board 204*b*.

According to various embodiments, the coupling member 261 (e.g., the coupling member 161 shown in FIG. 4) is engaged with first hole 243 through the second hole 257 to fix the conductive plate 251 and/or the connecting member 205 to the printed circuit board 204*b*. As another example, the coupling member 261 may include a conductive material, at least in part. For example, the conductive plate 251 and/or the connecting member 205 may be electrically connected to the metal member 265 through the coupling member 261. According to various embodiments, the conductive plate 251 and/or the connecting member 205 may come into contact, at least in part, with the metal member 265 while being mounted on the printed circuit board 204*b* by the coupling member 261. For example, the conductive plate 251 and/or the connecting member 205 may be electrically connected to the metal member 265 by direct contact with the metal member 265.

According to various embodiments, with reference to FIG. 5, the aforementioned electronic device 100 may further include a support member 263. The support member 263 may be interposed between the conductive plate 251 and the printed circuit board 204*b*, and may include a conductive material in order to thereby electrically connect the conductive plate 251 to the metal member 265. The support member 263 may be positioned in a specific area 267 on the printed circuit board 204*b*, and may come into contact, at least in part, with the metal member 265. The state in which the connecting member 205 of the electronic device 100 is mounted on the printed circuit board 204*b* is shown in FIG. 6.

Figure 7:
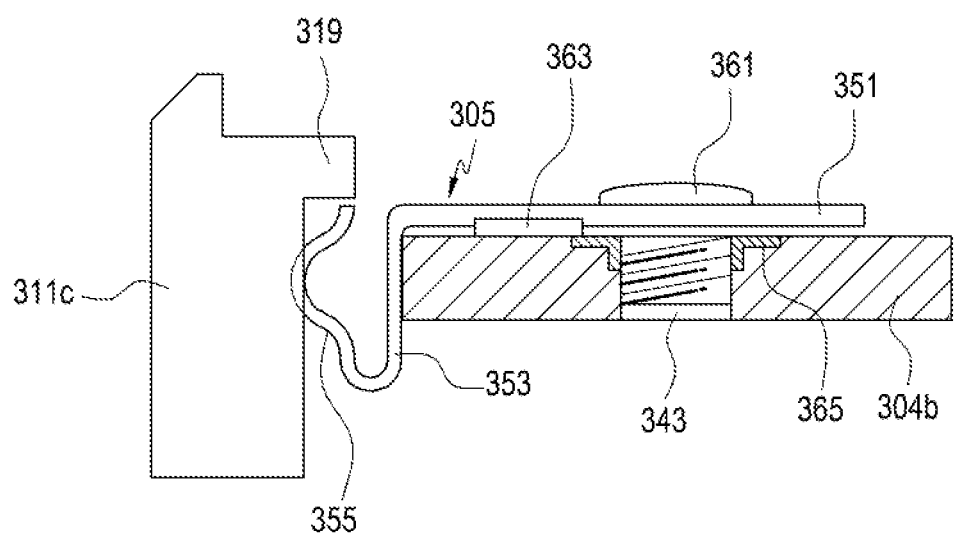
FIG. 7 is a side view showing the state in which a connecting member of the electronic device is mounted on the printed circuit board, which is obtained by cutting a portion of the printed circuit board according to various embodiments of the present disclosure.

FIG. 7 is a side view showing the state in which a connecting member 305 of the electronic device is mounted on the printed circuit board, which is obtained by cutting a portion of the printed circuit board according to various embodiments of the present disclosure.

Referring to FIG. 7, the printed circuit board 304*b* (e.g., the second printed circuit board 104*b* shown in FIG. 4), according to various embodiments of the present disclosure, may be mounted such that one lateral side thereof is adjacent to the lateral side (or the side wall) 311*c* of the housing. According to various embodiments, the support piece 353 (e.g., the support piece 253 shown in FIG. 5) and the elastic piece 355 (e.g., the elastic piece 255 shown in FIG. 5) of the connecting member 305 is inserted between the printed circuit board 304*b* and the lateral side 311*c* so that the conductive plate 351 (e.g., the conductive plate 251 shown in FIG. 5) and/or the connecting member 305 may be mounted and assembled to the printed circuit board 304*b*. According to various embodiments, when the connecting member 305 is assembled in the state in which the printed circuit board 304*b* is mounted in the housing (e.g., the case member 101 shown in FIG. 3 and/or FIG. 4), the support piece 353 of the connecting member 305 is supported by one lateral side of the printed circuit board 304*b*, and the elastic piece 355 may come into contact with the inner surface of the lateral side 311*c*. According to various embodiments, the lateral side 311*c* may include an interference protrusion 319 that protrudes inward. The interference protrusion 319 may be positioned adjacent to one end of the elastic piece 355 to limit the range in which the elastic piece 355 is deformed. For example, one end of the elastic piece 355 is adjacent to the interference protrusion 319 and the other end thereof is connected to the support piece 353 in order to thereby limit the range in which the elastic piece 355 can be deformed and/or in order to thereby limit the range in which one end thereof can move. For example, when the elastic piece 355 comes into contact with the lateral side (or the side wall) 311*c*, the contact state may be more stably maintained.

According to various embodiments, with reference to FIG. 7, the aforementioned electronic device 100 may further include the support member 363. The coupling member 361 (e.g., the coupling member 261 shown in FIG. 5) may be engaged on one side of the support member 363, and the support piece 353 and the elastic piece 355 may be positioned on the other side of the support member 363. According to various embodiments, a portion of the connecting member 305 and/or the conductive plate 351 may be spaced from the printed circuit board 304*b* by the thickness of the support member 363. According to various embodiments, with the engagement of the coupling member 361, a portion of connecting member 305 and/or the conductive plate 351 may come into tight contact with the printed circuit board 304*b* (for example, may be moved downward or may be deformed) on one side of the support member 363. According to various embodiments, as a portion of connecting member 305 and/or the conductive plate 351 come into tight contact with the printed circuit board 304*b* on one side of the support member 363, the support piece 353 and the elastic piece 355 may move upwardly on the other side of the support member 363. According to various embodiments, since the interference protrusion 319 interferes with the elastic piece 355, the support piece 353 and the elastic piece 355 may be restricted from moving upwardly on the other side of the support member 363. Additionally or alternatively, the interference protrusion 319 interferes with the elastic piece 355 so that the elastic piece 355 may come into tighter contact with the lateral side 311*c*. For example, the interference protrusion 319 may interfere with the elastic piece 355 in order to thereby induce the deformation of the elastic piece 355 such that the elastic piece 355 comes into contact with the more surface area of the lateral side 311*c*. In addition, FIG. 7 is a cross-sectional view which illustrates a metal member 365 (e.g., the metal member 265 shown in FIG. 5) configured for coming in contact with at least one surface of the printed circuit board 304*b* and at least a portion of an outer periphery of a hole 343 (e.g., the first hole 243 shown in FIG. 5) of the printed circuit board 304*b*, with the coupling member 361 (e.g., the coupling member 261 shown in FIG. 5) positioned through the conductive plate 351 and into the hole 343, to couple the conductive plate 351 to the printed circuit board 304b.

Figure 8A:
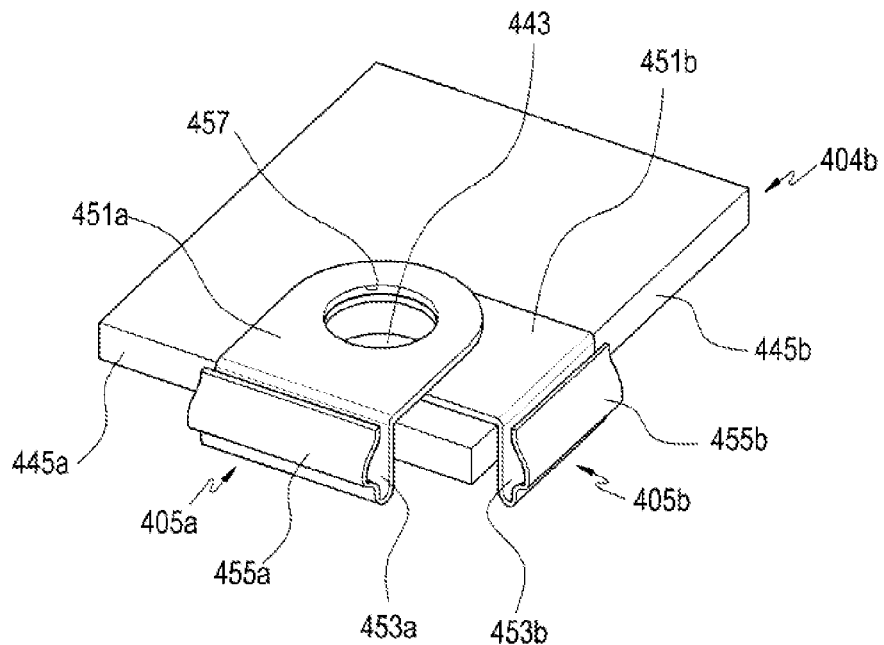
FIGS. 8A and 8B are views to explain various types of connecting members in the electronic device according to various embodiments of the present disclosure.
Figure 8B:
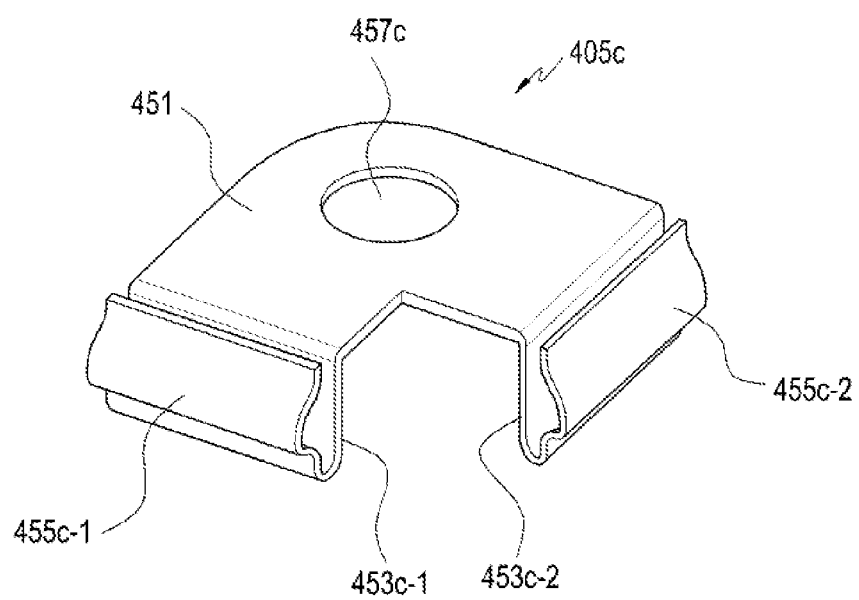

FIGS. 8A and 8B are views to explain various types of connecting members 405a, 405b, and 405c in the electronic device according to various embodiments of the present disclosure.

Referring to FIG. 8A, the electronic device, according to various embodiments of the present disclosure, may be provided with a plurality of connecting members 405a and 405b (e.g., the connecting member 105 in FIG. 4). For example, the printed circuit board 404b (e.g., the second printed circuit board 104b shown in FIG. 4) may have the first hole(s) 443 that is adjacent to the corner of two lateral sides 445a and 445b. Among the connecting members, the first connecting member 405a may be disposed while the support piece 453a is supported by the first lateral side 445a of the printed circuit board 404b, and the second connecting member 405b may be disposed while the support piece 453b is supported by the second lateral side 445b of the printed circuit board 404b. Power may be supplied to two different points of the antenna radiating body (e.g., the antenna radiating body 115 shown in FIG. 3) and/or two different antenna radiating bodies in common through the first and the second connecting members 405a and 405b. According to various embodiments, the conductive plate 451a connected with the first connecting member 405a and the conductive plate 451b connected with the second connecting member 405b may overlap each other at least in part when viewed from above the printed circuit board 404b. For example, the conductive plates 451a and 451b may overlap each other at least in part when viewed from the first surface 111a and/or the second face 111b of the housing of the electronic device 100 (shown in FIG. 3) described above. According to various embodiments, in the state in which the conductive plates 451a and 451b overlap each other at least in part, the second hole 457 formed on each of them may be aligned with the first hole 443 formed on the printed circuit board 404b.

According to various embodiments, the lateral side of the above-mentioned electronic device 100 (e.g., the lateral side (or the side wall) 111c shown in FIG. 3 and/or FIG. 4) may include a plurality of antenna radiating bodies, and the connecting members that are equal to, or less than, the number of antenna radiating bodies included in the lateral side may be disposed on the printed circuit board 404b. According to various embodiments, in the case where the connecting members corresponding to the number of antenna radiating bodies are disposed, the antenna radiating bodies may be supplied with power independently from each other, and may transmit and receive wireless signals in different frequency bands, respectively. According to various embodiments, if the number of connecting members is less than the number of antenna radiating bodies, the antenna radiating body that is not in direct contact with the connecting member may be supplied with power through the electromagnetic coupling with other adjacent antenna radiating bodies.

According to various embodiments, although FIG. 8A shows that a plurality of connecting members (e.g., the first and the second connecting members 405a and 405b) and/or the conductive plates 451a and 451b are disposed to partially overlap each other, the present disclosure is not limited thereto. For example, the connecting member of the electronic device, according to various embodiments, may include a plurality of (e.g., a pair of) support pieces (e.g., the support pieces 453a and 453b) that are extended from a single conductive plate and/or elastic pieces (e.g., the elastic pieces 455a and 455b), and the support pieces may be supported by two different lateral sides (e.g., the lateral sides 445a and 445b) of the printed circuit board 404b, respectively.

Referring to FIG. 8B, the connecting member 405c, according to various embodiments, may include conductive plates 451 that are extended in at least two different directions. The conductive plates 451 may be extended in the direction perpendicular to each other from the position where the second hole 457c (e.g., the second hole 457 shown in FIG. 8A) is formed. Support pieces 453c-1 and 453c-2 and/or elastic pieces 455c-1 and 455c-2 may be formed at the ends of the conductive plates 451, respectively. For example, when the connecting member 405c shown in FIG. 8B, which is configured as a single component, is mounted on the printed circuit board (e.g., the printed circuit board 404b shown in FIG. 8A), it can provide the arrangement of the connecting members 405a and 405b shown in FIG. 8A.

Figure 9:
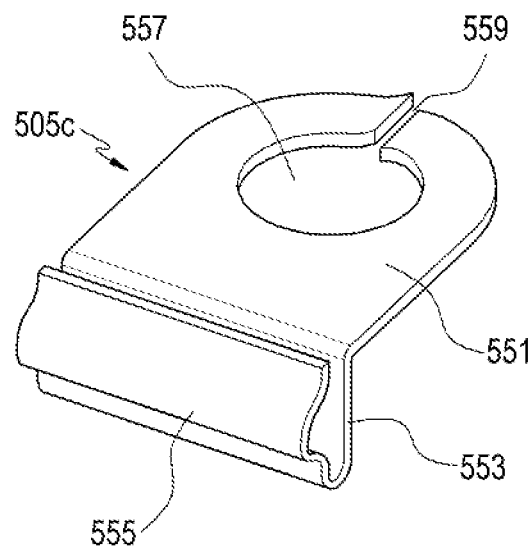
FIG. 9 is a perspective view showing an embodiment of the connecting member of the electronic device according to various embodiments of the present disclosure.

FIG. 9 is a perspective view showing an embodiment of a connecting member 505c of the electronic device according to various embodiments of the present disclosure.

Figure 10:
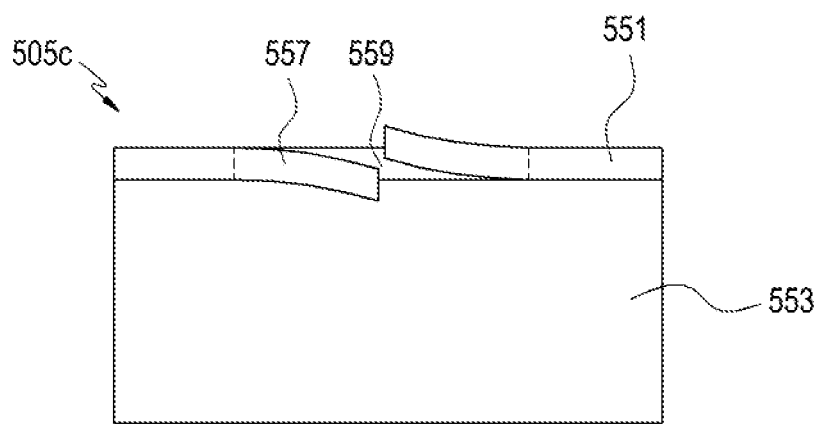
FIG. 10 is a side view showing an embodiment of the connecting member of the electronic device according to various embodiments of the present disclosure.

FIG. 10 is a side view showing an embodiment of a connecting member 505c of the electronic device according to various embodiments of the present disclosure.

Referring to FIGS. 9 and 10, the connecting member 505c and/or a conductive plate 551, according to various embodiments, may have one or more slits 559 that are formed around the second hole 557 (for example, that is extended from the second hole 557 to traverse a portion of the conductive plate 551). According to various embodiments, one portion of the conductive plate 551 on one side of the slit 559 may be bent toward one of either the first surface 111a or the second surface 111b of the housing of the aforementioned electronic device 100 shown in FIG. 3 (for example, one side of the slit 559 may be bent to be away from the printed circuit board (e.g., the second printed circuit board 104b shown in FIG. 4)). As another example, the other portion of the conductive plate 551 on the other side of the slit 559 may be bent toward the other of the first surface 111a or the second surface 111b (for example, may be bent toward the second printed circuit board 104b).

According to various embodiments, when the coupling member (e.g., the coupling member 161 shown in FIG. 4) couples the connecting member 505 to the printed circuit board (e.g., the second printed circuit board 104b shown in FIG. 4), each portion of the conductive plate 551 on both sides of the slit 559 may come into contact with one of either the metal member (e.g., the metal member 265 shown in FIG. 5) or the coupling member 161 (shown in FIG. 4). According to various embodiments, the conductive plate 551 may be made of a material having an elastic restoring force, and the portions of the conductive plate 551 may apply an elastic force to the second printed circuit board 104b and the coupling member 161 in the engagement direction of the coupling member 161 and/or in the opposite direction thereof in order to thereby strengthen the static frictional force between the coupling member 161 and the second printed circuit board 104b, and/or between the coupling member 161 and the conductive plate 551. For example, the coupling member 161 may be stably engaged and fixed by strengthening the static frictional force due to the bending of the portions of the conductive plate 551 on both sides of the slit 559 and by improving the deviation of the amount of tightening of the coupling member 161 around the second hole 557. For example, the frictional force of the coupling member 161 may be strengthened by forming the slit 559 in order to thereby prevent the fastening force of the coupling member 161 from being weakened by vibrations or shocks and in order to thereby improve the coupling state of the connecting member 505.

In general, a washer may be utilized in order to stabilize the fastened state of two or more components. However, the connecting member, according to various embodiments of the present disclosure, has the slit 559 formed thereon in order to thereby secure the stably mounted state onto the printed circuit board without using a separate washer. The structure of the connecting member, which provides the same, or a similar, function as the washer without adopting the washer, will be described in greater detail through the embodiments below.

According to various embodiments, a portion of the conductive plate 551, which is in contact with the printed circuit board (e.g., the second printed circuit board 104b shown in FIG. 4), for example, may come into tight contact with the metal member (e.g., the metal member 265 shown in FIG. 5). According to various embodiments, the metal member 265 and the conductive plate 551 may be more stably and electrically connected with each other by forming a portion of the conductive plate 551 to be bent and by allowing the same to come into tight contact with the metal member 265. According to various embodiments, the support member 263 may have a ring shape, which is disposed around the first hole (e.g., the first hole 143 shown in FIG. 4) and/or the second hole 557, and both sides of the slit may have a bent shape. Such a support member may strengthen the static frictional force of the coupling member (e.g., the coupling member 161 shown in FIG. 4) in order to thereby form a stable fastening and fixing structure. In addition, FIGS. 9 and 10 show the connecting member 505c including a support piece 553 that is extended to be bent from the conductive plate 551, and an elastic piece 555 that is extended from the support piece 553.

Figure 11:
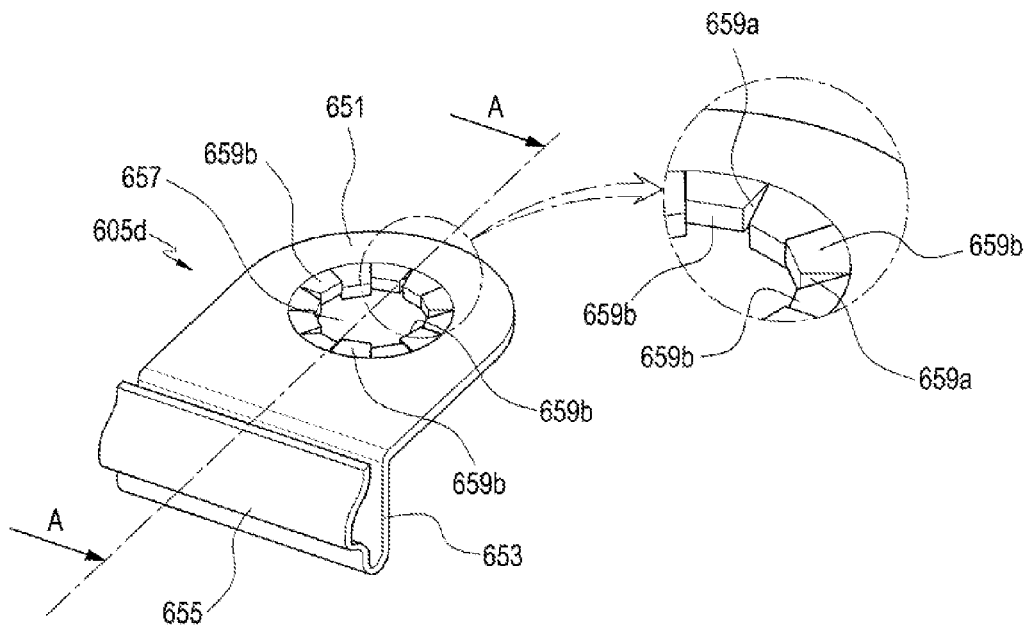
FIG. 11 is a perspective view showing another embodiment of the connecting member of the electronic device according to various embodiments of the present disclosure.

FIG. 11 is a perspective view showing another embodiment of a connecting member 605d of the electronic device according to various embodiments of the present disclosure.

Figure 12:
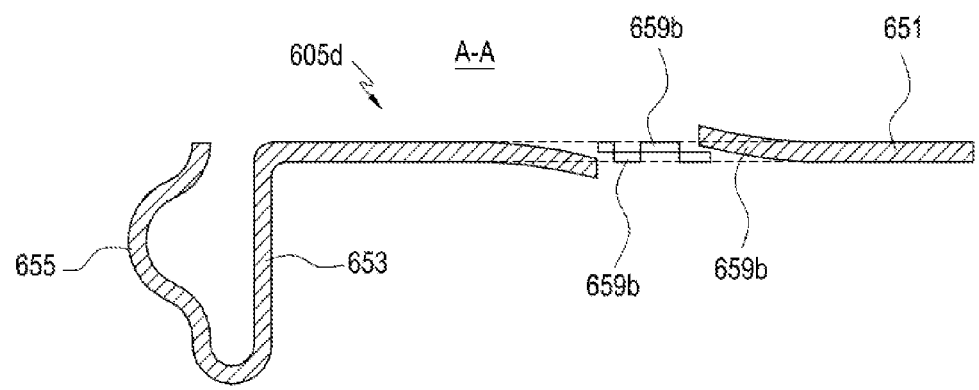
FIG. 12 is a cross-sectional view showing another embodiment of the connecting member of the electronic device according to various embodiments of the present disclosure.

FIG. 12 is a cross-sectional view showing another embodiment of a connecting member 605d of the electronic device according to various embodiments of the present disclosure.

Referring to FIGS. 11 and 12, the connecting member 605d and/or the conductive plate 651, according to various embodiments, may include a plurality of slits 659a. The slits 659a may be arranged in the circumferential direction around the second hole 657, and, for example, the slits 659a may be extended in the inward direction of the conductive plate 651 from second hole 657 along the radial direction of the second hole 657. According to various embodiments, the second support piece 659b may be formed between two adjacent slits 659a, and the second support piece 659b may come into tight contact with one of the metal member (e.g., the metal member 265 shown in FIG. 5) or the coupling member (e.g., the coupling member 261 shown in FIG. 5). For example, the second support pieces 259b may be alternately bent toward one of either the first surface 111a or the second surface 111b of the housing of the electronic device 100. According to various embodiments, the second support pieces 659b may have various shapes, and may be bent in various directions (for example, may protrude toward the first surface 111a or toward the second surface 111b).

According to various embodiments, when the coupling member (e.g., the coupling member 261 shown in FIG. 5) couples the conductive plate 651 to the printed circuit board (e.g., the printed circuit board 204b shown in FIG. 5), the second support pieces 659b may come into tight contact with one of the printed circuit board 204b (e.g., the metal member 265 of the printed circuit board shown in FIG. 5) or the coupling member 261. For example, the second support pieces 659b may stably fix the coupling member 161 by strengthening the static frictional force between the coupling member 161 and the printed circuit board 104b and/or between the coupling member 161 and the conductive plate 651. According to various embodiments, some of the second support pieces 659b come into tight contact with the metal member 265, thereby more stably and electrically connecting the metal member 265 and the conductive plate 651 with each other. In addition, FIGS. 11 and 12 show the connecting member 605d including a support piece 653 that is extended to be bent from the conductive plate 651, and an elastic piece 655 that is extended from the support piece 653.

Figure 13:
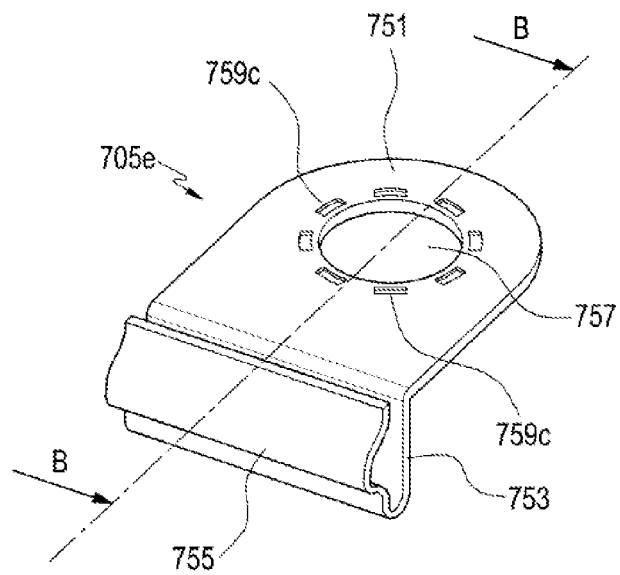
FIG. 13 is a perspective view showing another embodiment of the connecting member of the electronic device according to various embodiments of the present disclosure.

FIG. 13 is a perspective view showing another embodiment of a connecting member 705e of the electronic device according to an embodiment of the present disclosure.

Figure 14:
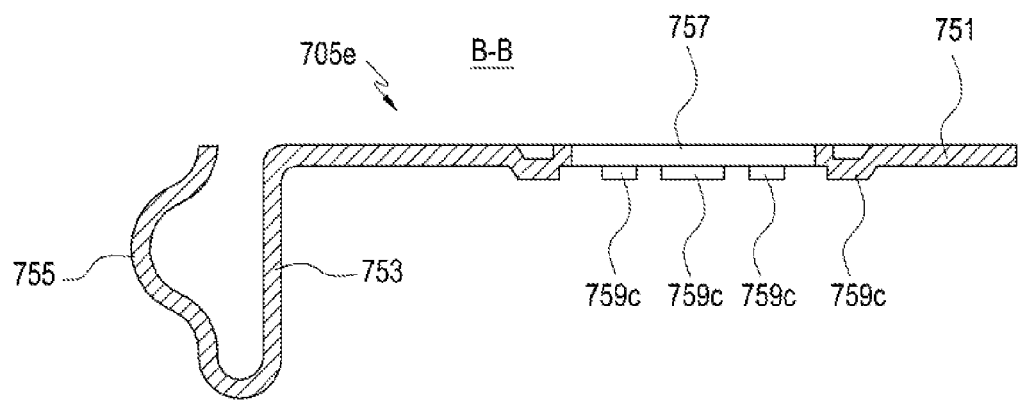
FIG. 14 is a cross-sectional view showing another embodiment of the connecting member of the electronic device according to various embodiments of the present disclosure.

FIG. 14 is a cross-sectional view showing another embodiment of a connecting member 705e of the electronic device according to an embodiment of the present disclosure.

The connecting member 705e and/or the conductive plate 751, according to various embodiments, may include a plurality of concave/convex portions 759c. The concave/convex portions 759c may be arranged in the circumferential direction around the second hole 757, wherein the concave/convex portions 759c may be recessed on one side and may protrude from the other side. For example, the concave/convex portions 759c may protrude from the surface of the conductive plate 751, which faces the printed circuit board (e.g., the second printed circuit board 104b shown in FIG. 4) and/or the metal member (e.g., the metal member 265 shown in FIG. 5). According to various embodiments, the concave/convex portions 759c may have various shapes, such as a circle or a polygon (e.g., a triangle, a rectangle, a square, a pentagon, or the like), and various sizes, and may alternately protrude from one side or the other side of the conductive plate 751.

According to various embodiments, when the coupling member (e.g., the coupling member 261 shown in FIG. 5) couples the conductive plate 751 to the printed circuit board (e.g., the printed circuit board 204b shown in FIG. 5), the concave/convex portions 759c may come into tight contact with a portion (e.g., the metal member 265) of the printed circuit board 204b. For example, the concave/convex portions 759c may come into tight contact with the printed circuit board 204b (e.g., the metal member 265), thereby more stably and electrically connecting the metal member 265 and the conductive plate 751 with each other. According to various embodiments, when the conductive plate 751 is mounted on the printed circuit board 204b, the concave/convex portions 759c may be pressed to some extent between the other surface of the conductive plate 751 and the metal member 265 in order to thereby accumulate an elastic force. The elastic force accumulated by the concave/convex portions 759c may increase the static frictional force between the coupling member 261 and the printed circuit board 204b and/or between the coupling member 261 and the conductive plate 751. For example, the concave/convex portions 759c maintain the electrical connection between the conductive plate 751 and the printed circuit board 204b and/or the fastened state of the coupling member 261 to be stable. In addition, FIGS. 13 and 14 show the connecting member 705e including a support piece 753 that is extended to be bent from the conductive plate 751, and an elastic piece 755 that is extended from the support piece 753.

An electronic device, according to various embodiments of the present disclosure, may include: a housing that includes a first surface that is directed in the first direction, a second surface that is directed in the second direction opposite or substantially opposite to the first direction, and a lateral side (or a side wall) that surrounds, at least in part, a space formed between the first surface and the second surface; a display that is exposed through the first surface of the housing; an antenna radiating body that forms at least a portion of the lateral side (or the side wall) of the housing; a printed circuit board that is disposed in the housing, and that includes a first hole and a metal member that is positioned, at least in part, in the first hole; a flexible connecting member that is disposed between at least a portion of the antenna radiating body and at least a portion of the metal member, and that includes a conductive material; a conductive plate configured for contacting with the connecting member, or being formed by a portion of the connecting member to include a second hole; and a coupling member configured for coupling the conductive plate to the printed circuit board by passing through the second hole of the conductive plate and contacting with the metal member.

According to various embodiments, the electronic device may further include one or more slits that are extended from the second hole to traverse a portion of the conductive plate around the second hole.

According to various embodiments, one portion of the conductive plate on one side of the slit may be bent in the first direction and the other portion of the conductive plate on the other side of the slit may be bent in the second direction.

According to various embodiments, one portion of the conductive plate on one side of the slit may come into tight contact with the metal member and the other portion of the conductive plate on the other side of the slit may come into tight contact with the coupling member.

According to various embodiments, the one or more slits may include a plurality of small slits, and the plurality of small slits may be extended in the radial direction of the second hole and may be arranged in the circumferential direction of the second hole around the second hole. In addition, the electronic device may further include a plurality of support pieces that are formed between the adjacent slits among the plurality of small slits, and the support pieces may be configured for coming into tight contact with one of either the metal member or the coupling member.

According to various embodiments, the support pieces may be alternately bent toward one of either the first direction or the second direction so as to alternately come into tight contact with one of either the metal member or the coupling member.

According to various embodiments, the electronic device may further include concave/convex portions that are formed around the second hole, wherein the concave/convex portions are disposed to face the printed circuit board.

According to various embodiments, the concave/convex portions may be recessed on one side of the conductive plate, and may protrude on the other side of the conductive plate.

According to various embodiments, a plurality of concave/convex portions may be arranged around the second hole.

According to various embodiments, the connecting member may include: a support piece that is extended from the conductive plate to be supported by the lateral side of the printed circuit board; and an elastic piece that is extended from the support piece to face, at least in part, the support piece, wherein the elastic piece is configured for coming into contact with the antenna radiating body.

According to various embodiments, the electronic device may further include another flexible connecting member that is disposed between at least the other portion of the antenna radiating body and at least a portion of the metal member, and that includes a conductive material According to various embodiments, the support piece of the connecting member may be supported by the first lateral side of the printed circuit board and the support piece of the other connecting member may be supported by the second lateral side of the printed circuit board, respectively, wherein the conductive plate connected to the connecting member and the conductive plate connected to the other connecting member may be disposed to overlap each other when viewed from above the first surface of the housing.

According to various embodiments, the conductive plate connected to the connecting member and the conductive plate connected to the other connecting member may be coupled to the printed circuit board by the one coupling member.

According to various embodiments, the conductive plate may be mounted on one surface of the printed circuit board and one end of the elastic piece may be positioned between the surface of the conductive plate and the other surface of the printed circuit board.

According to various embodiments, the electronic device may further include a support member of a conductive material, which is disposed between the conductive plate and the printed circuit board.

According to various embodiments, at least a portion of the support member may be disposed in contact with the metal member.

According to various embodiments, the electronic device may further include an interference protrusion that protrudes to the inside of the housing from the lateral side (or the side wall) of the housing, and the interference protrusion may limit the deformation of the elastic piece.

According to various embodiments, the electronic device may further include: a communication circuit that is mounted on the printed circuit board; and a connecting circuit that connects the metal member to the communication circuit.

According to various embodiments, the connecting circuit may include an impedance matching circuit for the antenna radiating body.

An electronic device, according to various embodiments of the present disclosure, may include a housing that has a lateral side (or a side wall) of which a portion forms an antenna radiating body, a printed circuit board configured to being disposed in the housing, and that includes a communication circuit, a flexible connecting member of which a portion thereof is configured for coming into contact with the antenna radiating body; and a conductive plate configured for coming into contact with the connecting member, or being formed by a portion of the connecting member to be mounted on the printed circuit board, wherein the connecting member may include a support piece that is extended from the conductive plate to be supported by a lateral side of the printed circuit board, and an elastic piece that is extended from the support piece to face, at least in part, the support piece, and the elastic piece may come into contact with the antenna radiating body in order to thereby connect the antenna radiating body to the communication circuit.

Although the specific embodiments have been described in the detailed description of the present disclosure, it is obvious to those skilled in the art that the present disclosure may be variously modified without departing from the scope of the disclosure.

For example, although the connecting member has been described to be mounted on the second printed circuit board in the description of the various embodiments of the present disclosure, the present disclosure does not need to be limited thereto. The aforementioned electronic device may include one printed circuit board and/or three or more printed circuit boards according to the mounting space therein, and the connecting member may be disposed in any one of the printed circuit boards in the electronic device. For example, if a portion to be electrically connected to the circuit devices of the electronic device through the connecting member is positioned adjacent to the third printed circuit board, the connecting member may be mounted on the third printed circuit board.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
    a housing comprising:
        a first surface directed in a first direction,
        a second surface directed in a second direction substantially opposite to the first direction, and
        a lateral side that surrounds, at least in part, a space formed between the first surface and the second surface;
    a display exposed through the first surface of the housing;
    an antenna radiating body that forms at least a portion of the lateral side;
    a printed circuit board disposed in the housing and that includes a first hole and a metal member positioned, at least in part, in the first hole;
    a flexible connecting member disposed between at least a portion of the antenna radiating body and at least a portion of the metal member, and that includes a conductive material;
    a conductive plate configured for:
        contacting the connecting member, or
        being formed by a portion of the connecting member to include a second hole; and
    a coupling member configured for:
        coupling the conductive plate to the printed circuit board by passing through the second hole of the conductive plate, and
        contacting with the metal member.

2. The electronic device according to claim 1, further comprising one or more slits that are extended from the second hole to traverse a portion of the conductive plate around the second hole.

3. The electronic device according to claim 2,
    wherein one portion of the conductive plate on one side of the slit is bent in the first direction, and
    wherein the other portion of the conductive plate on the other side of the slit is bent in the second direction.

4. The electronic device according to claim 2,
    wherein one portion of the conductive plate on one side of the slit is configured for tightly contacting with the metal member, and
    wherein the other portion of the conductive plate on the other side of the slit is configured for tightly contacting with the coupling member.

5. The electronic device according to claim 2,
    wherein the one or more slits comprise a plurality of small slits,
    wherein the plurality of small slits is extended in the radial direction of the second hole and are arranged in a circumferential direction of the second hole around the second hole,
    wherein the one or more slits further comprise a plurality of support pieces formed between the adjacent slits among the plurality of small slits, and
    wherein the support pieces are configured for coming into tight contact with one of either the metal member or the coupling member.

6. The electronic device according to claim 5, wherein the support pieces are alternately bent toward one of either the first direction or the second direction so as to alternately come into tight contact with one of either the metal member or the coupling member.

7. The electronic device according to claim 1, further comprising:
    at least one concave/convex portion that is formed around the second hole,
    wherein the at least one concave/convex portion is disposed to face the printed circuit board.

8. The electronic device according to claim 7, wherein the at least one concave/convex portion is recessed on one side of the conductive plate, and protrude on the other side of the conductive plate.

9. The electronic device according to claim 7, wherein at least one concave/convex portion is arranged around the second hole.

10. The electronic device according to claim 1, wherein the connecting member comprises:
    a support piece extended from the conductive plate to be supported by a first lateral side of the printed circuit board; and
    an elastic piece that is extended from the support piece to face, at least in part, the support piece,
    wherein the elastic piece is configured for coming into contact with the antenna radiating body.

11. The electronic device according to claim 10, further comprising:
    another flexible connecting member disposed between at least the other portion of the antenna radiating body and at least a portion of the metal member,
    wherein the other flexible connecting member comprises a conductive material.

12. The electronic device according to claim 11,
    wherein the support piece of the connecting member is supported by the first lateral side of the printed circuit board,
    wherein the support piece of the other connecting member is supported by a second lateral side of the printed circuit board, respectively, and
    wherein the conductive plate connected to the connecting member and the conductive plate connected to the other connecting member are disposed to overlap each other when viewed from above the first surface of the housing.

13. The electronic device according to claim 12, wherein the conductive plate connected to the connecting member and the conductive plate connected to the other connecting member are coupled to the printed circuit board by the one coupling member.

14. The electronic device according to claim 10,
    wherein the conductive plate is mounted on one surface of the printed circuit board, and wherein one end of the elastic piece is positioned between the surface of the conductive plate and the other surface of the printed circuit board.

15. The electronic device according to claim 10, further comprising:
a support member comprising a conductive material,
wherein the support member is disposed between the conductive plate and the printed circuit board.

16. The electronic device according to claim 15, wherein at least a portion of the support member is configured for contacting the metal member.

17. The electronic device according to claim 1, further comprising:
an interference protrusion that protrudes to an inside of the housing from the lateral side of the housing, wherein the interference protrusion limits the deformation of the elastic piece.

18. The electronic device according to claim 1, further comprising:
a communication circuit mounted on the printed circuit board; and
a connecting circuit configured for connecting the metal member to the communication circuit.

19. The electronic device according to claim 18, wherein the connecting circuit comprises an impedance matching circuit for the antenna radiating body.

20. An electronic device comprising:
a housing comprising a lateral side of which a portion forms an antenna radiating body;
a printed circuit board configured for being disposed in the housing and that includes a communication circuit;
a flexible connecting member of which a portion thereof is configured for coming into contact with the antenna radiating body; and
a conductive plate configured for:
coming into contact with the connecting member, or being formed by a portion of the connecting member to be mounted on the printed circuit board,
wherein the connecting member comprises:
a support piece that is extended from the conductive plate to be supported by a lateral side of the printed circuit board, and
an elastic piece that is extended from the support piece to face, at least in part, the support piece, and
wherein the elastic piece is configured for coming into contact with the antenna radiating body to connect the antenna radiating body to the communication circuit.

* * * * *